United States Patent [19]

Hamada et al.

[11] Patent Number: 4,716,571

[45] Date of Patent: Dec. 29, 1987

[54] A HIGH-OUTPUT SEMICONDUCTOR LASER OF DOVE TAIL GROOVE TYPE

[75] Inventors: Ken Hamada, Toyonaka; Masaru Wada, Takatsuki; Kunio Itoh, Uji, all of Japan

[73] Assignee: Matsushita Electric Industrial Co., Ltd., Kadoma, Japan

[21] Appl. No.: 886,763

[22] Filed: Jul. 16, 1986

Related U.S. Application Data

[63] Continuation of Ser. No. 549,758, Nov. 8, 1983, abandoned.

[30] Foreign Application Priority Data

Nov. 11, 1982 [JP]  Japan ................................ 57-198713

[51] Int. Cl.$^4$ ................................................ H01S 3/19
[52] U.S. Cl. ........................................ 372/48; 357/17; 372/46
[58] Field of Search .................... 372/44, 45, 46, 48; 357/17

[56] References Cited

FOREIGN PATENT DOCUMENTS 0026062  4/1981  European Pat. Off. ............. 372/48

OTHER PUBLICATIONS

Botez et al., "Channel Waveguide AlGaAs Edge Emitting LED", *IBM Technical Disclosure Bulletin*, vol. 21, No. 3, Aug. 1978, pp. 1260.
Y. Noda et al., "High Temperature CW Operation of 1.5 μm InGaAsP/InP Buffer-Layer Loaded Planoconvex Waveguide Lasers", Electronics Letters vol. 17, No. 6, Mar. 19, 1981, pp. 226-227.
J. P. Noad et al., "Channelled Substrate Lasers . . . ", *Electronics Letters*, vol. 16, No. 18, Aug. 28, 1980, pp. 685-686.

*Primary Examiner*—James W. Davie
*Attorney, Agent, or Firm*—Cushman, Darby & Cushman

[57] ABSTRACT

A semiconductor substrate having a groove with a dove-tail-shaped cross section is used as a substrate and thereon, several epitaxial layers including an active layer are formed and a current injection region is formed immediately above the groove; the semiconductor laser attains a high power lasing with the fundamental transverse mode.

5 Claims, 6 Drawing Figures

A HIGH-OUTPUT SEMICONDUCTOR LASER OF DOVE TAIL GROOVE TYPE

This is a continuation of application Ser. No. 549,758, filed Nov. 8, 1983, which was abandoned upon the filing hereof.

BACKGROUND OF THE INVENTION

1. Field of the Invention

The present invention relates to an improvement of a semiconductor laser and method of making the same.

2. Description of the Prior Art

In recent years, there is a large demand for semiconductor lasers which can lase a high power output in the fundamental transverse mode, for instance for use in writing on an optical disk file or the like. In order to stabilize the transverse mode lasing, it is a very effective measure to provide a groove on the substrate.

As one prior art example of such a semiconductor laser, a CSP (channeled substrate planar) laser is shown in FIG. 1. The CSP laser shown in FIG. 1 comprises an n-GaAs substrate 1, an n-Ga$_{1-x}$Al$_x$As first clad layer 2, a non-doped Ga$_{1-y}$Al$_y$As active layer 3, p-Ga$_{1-x}$Al$_x$As second clad layer 4 and n-GaAs cap layer 5. A p-side metal electrode 6 and an n-side electrode 7 are respectively provided on the upper face and bottom face of the wafer. And an ohmic electrode 8 is formed by diffusing Zn to extend into the second clad layer 4 by a thermal diffusion process.

In this semiconductor laser, the substrate 1 has a channel 11 which has upwardly opening side walls 10, 10, so that the first clad layer 2 has a thicker part on the part of the channel 11 and thinner part on both sides thereof. By such a configuration, light which is lased in the active layer 3 and leading towards the substrate 1 is absorbed with different degrees, that is, much is absorbed in the thinner parts. Thereby, the transverse mode oscillation is well confined in the active layer 3 at the part which is just above the groove, thereby realizing fundamental transverse mode lasing.

Generally speaking, absorption of lased light in the substrate should be made as small as possible in order to realize a high output lasing in the semiconductor laser to thereby increase the external differential quantum efficiency. In the CSP laser of the prior art shown in FIG. 1, since it is manufactured by using a forward mesa-substrate, the shape of the groove 11 becomes an upwardly open shape, and this groove is not suitable for attaining a high output of lasing. This is because if a very deep groove is intended to be made in order to confine a sufficient amount of lased light, the inclined side walls 10, 10 of the groove 11 (a-b and c-d) become long. Accordingly, light absorption at these broad walls becomes large, thereby making achievement of a high external differential quantum efficiency difficult.

SUMMARY OF THE INVENTION

The present invention purposes to provide an improved semiconductor laser capable of lasing in the fundamental transverse mode with stable high output lasing. Such an improvement can be made by improving the configuration of a groove of the substrate on which several epitaxial layers including an active layer is to be formed.

The semiconductor laser in accordance with the present invention comprises:

a semiconductor substrate having on its principal surface a channel formed as a groove having a dove-tail-shaped cross-section, for defining an active region, epitaxial layers including an active layer, which are formed on the principal surface, and a current injection region formed above the groove.

Furthermore, the method of making semiconductor laser in accordance with the present invention comprises the steps of:

providing a channel formed as a groove of an inverted trapezoidal cross-section on a principal surface of a semiconductor substrate, epitaxially growing a first layer on the semiconductor substrate, simultaneously melting back edges at the upper ends of the side walls of the groove, thereby forming a dove-tail-shaped cross section of the groove, and subsequently epitaxially growing on the first layer, to form layers including an active layer, and forming a current injection region at the part immediately above the groove.

DESCRIPTION OF THE PREFERRED EMBODIMENTS

Figure 2A:
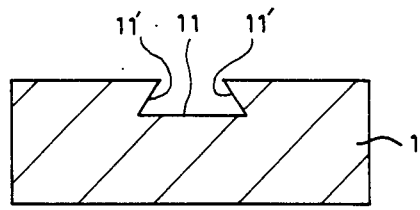
FIG. 2(a), FIG. 2(b), FIG. 2(c) and FIG. 2(d) are sectional elevation views showing various steps of manufacturing a semiconductor layer embodying the present invention.

Hereinafter an example in accordance with the present invention is described with reference to the accompanying drawings, FIG. 2(a), FIG. 2(b), FIG. 2(c) and FIG. 2(d). First, the outline of the manufacturing steps is elucidated. Firstly as shown in FIG. 2(a), on a principal surface of a reverse mesa type semiconductor substrate 1 of n-conductivity type, a groove 1 having a trapezoidal shape in cross-section is formed by wet chemical etching. The reverse mesa substrate is defined as the substrate having such a characteristic as to form the trapezoidal shape groove when etched by the wet chemical etching.

Figure 2B:
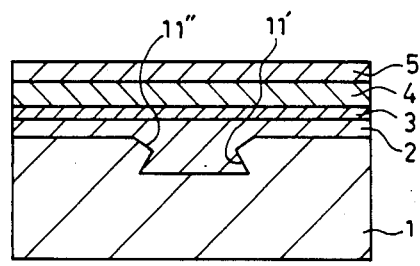
Figure 2C:
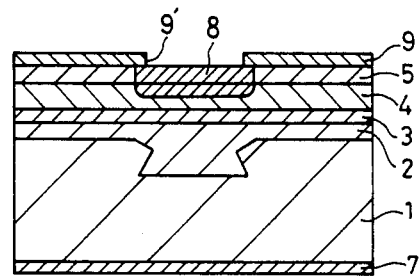

Next as shown in FIG. 2(b), several epitaxial growth layers, namely, a first layer of n-type first clad layer 2, a second layer of active layer 3, a third layer of p-type second clad layer 4 and a fourth layer of an n-type current limiting layer 5 are sequentially formed. In this epitaxial growth process, as a result of melt-back of the edge parts which are at the upper end of the inclined walls, the inclined walls are reformed to have upward-open shaped inclined surfaces 11″, 11″, to thereby change the cross-sectional shape groove to a dove-tail. Thereafter, a p-type impurity 8 is diffused from the top surface of the wafer at the part immediately above the groove by selective diffusion, in a manner that the diffusion front reaches and stops in the second clad layer 4, as shown in FIG. 2(c), by utilizing a known mask 9. Then after removing the mask 9, a p-side ohmic electrode 6 is formed on the uppermost layer 5. Also, an n-side ohmic electrode 7 is formed on the bottom of the substrate 1 as shown in FIG. 2(d).

Figure 1:
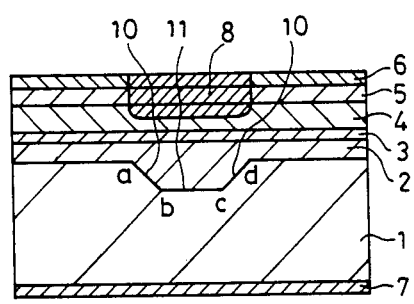
FIG. 1 is a sectional elevation view of the semiconductor laser of the prior art.
Figure 2D:
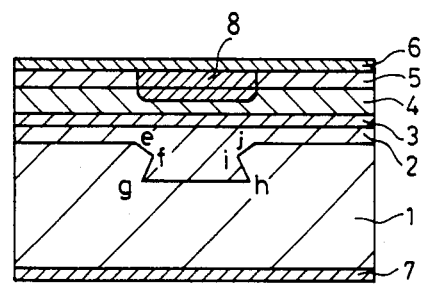

By the configuration of the semiconductor laser as shown in FIG. 2(d), upward-open inclined surfaces e-f and i-j can be shortened with respect to those of the counter part upward-open inclined surface a-b and c-d of FIG. 1. Since the inclined wall parts only consume invalid current, the width in plan view of such inclined parts should be as small as possible with respect to a depth of the groove. Thus, the bent wall e-f-g and j-i-h is effective in increasing the light output of the semiconductor laser.

Hereinafter, a more detailed actual example of manufacturing a semiconductor laser in accordance with the present invention is elucidated.

Firstly on a (100) surface of a GaAs reverse mesa substrate 1 of n-conductivity type, a straight groove of trapezoidal-shape cross section having a width of 5 μm at the bottom and 1.5 μm depth is formed in a direction of <011>, by the known wet chemical etching process. The epitaxial growth layers are formed, on the surface of the substrate 1. A first clad layer 2 of n-type $Ga_{0.65}Al_{0.35}As$ is formed as the first layer with a thickness of about 0.2 μm at the flat part of the substrate which is outside the groove. An active layer 3 of non-doped $Ga_{0.95}Al_{0.05}As$ is formed as the second layer with a thickness of about 0.05 μm. A second clad layer 4 of p-type $Ga_{0.65}Al_{0.35}As$ is formed as the third layer 4 with a thickness of about 1.5 μm, and a current limiting layer 5 of n-type GaAs is formed as the fourth layer with a thickness of about 0.5 μm in a liquid phase sequential epitaxial growth process.

When the epitaxial growth is made starting from a predetermined temperature of 790° C. with a supercooling of 5° C. and a cooling rate of 0.5° C./min, then the cross-sectional shape of groove 11 is formed by the melt-back into the dove-tail shape as shown in FIG. 2(b), which has an upward-open face 11", thereby forming the width of about 7 μm of the groove. Then a $Si_3N_4$ film 9 is formed as shown in FIG. 2(c) on the uppermost surface of the epitaxial growth layer, and a stripe-shaped opening 9' is formed at the part immediately above the groove of the substrate. Then zinc is diffused from the opening 9' into the epitaxial layers in a manner to reach to the second clad layer 4 of p-type $Ga_{0.65}Al_{0.35}As$, as shown in FIG. 2(c). Thereafter, the $Si_3N_4$ film 9 is removed, and a p-side electrode layer 6 is formed by vapor deposition of gold-zinc (Au-Zn) alloy. Thereafter by carrying out alloying, the side ohmic electrode 6 is formed. Also on the bottom face of the substrate an n-side electrode is formed by vapor deposition of Au-Ge-Ni alloy followed by alloying treatment, to form ohmic electrode 7 as shown in FIG. 2(d). The wafer thus produced is cleaved into individual units, and each unit is mounted on a silicon block to complete a semiconductor laser device.

The semiconductor laser device can lase in the fundamental transverse mode with a threshold current of about 50 mA, and can lase a high output power of about 100 mW to achieve external differential quantum efficiency of about 60%.

Figure 3:
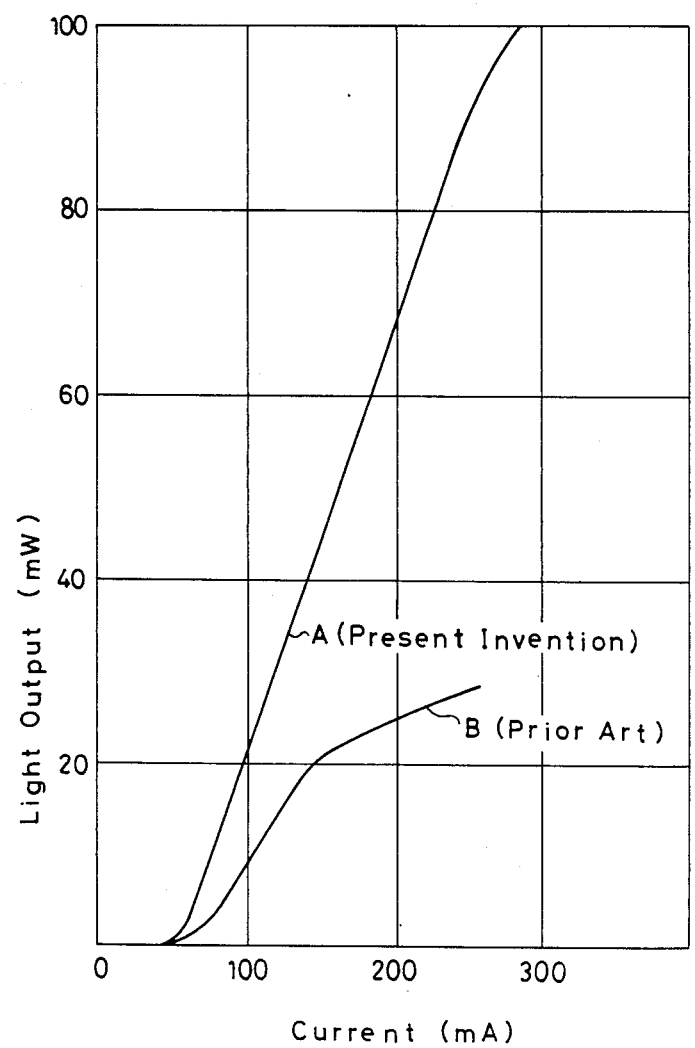
FIG. 3 is a graph showing light output vs. current characteristics of the semiconductor laser of the present invention (curve A) and of the prior art (curve B).

FIG. 3 is a comparison graph showing the light output vs. current characteristic of the present invention shown by curve A and of the prior art by curve B. Both examples of the present invention and the prior art are made in the same configuration having the grooves of the same width and depth and thicknesses of the respective epitaxial layers. As shown in FIG. 3 the prior art semiconductor laser shown by the curve B has a low external differential quantum efficiency, and also has a kink, whereby attainment of a high output is difficult. On the contrary, the example embodying the present invention shown by the curve A has a high external differential quantum efficiency and the curve has no particular kink, and easily outputs a high power lasing.

Though the above-mentioned example is a GaAs-GaAlAs semiconductor laser device, the present invention is applicable similarly to the InP-InGaAsP or other mixed crystal lasers.

The semiconductor laser in accordance with the present invention can lase a stable fundamental transverse mode with high power output, and so has a very high industrial utility.

What is claimed is:

1. A high-output seminconductor laser comprising:
   a semiconductor substrate havng a substantially flat principal surface, and a channel formed as a groove within said principal surface and below said flat surface, said groove having a dove-tail shaped cross-section for defining an active lasing region;
   a first electrode positioned on a second surface of said substrate opposite said channel;
   a first clad layer formed on said principal surface of said substrate;
   a flat active layer having a thickness sufficient to spread a laser light generated therein,
   at least another clad layer formed on the side of said active layer opposite said first clad layer;
   a second electrode positioned with respect to said active layer opposite said first electrode; and
   a current injection region formed above said groove and said active layer,
   said dove-tail shaped cross section having upper and lower parts which are wider than a middle part of the cross section.

2. A high-output semiconductor laser in accordance with claim 1, wherein said layers comprise:
   said first clad layer being of the same conductivity type as that of said substrate,
   said active layer being of a non-doped type formed on said first clad layer,
   said second clad layer being of the opposite conductivity type to that of said substrate formed on said active layer, and
   a current limiting layer of the same conductivity type as that of said substrate formed on said second clad layer, and
   said current injection region having a conductivity opposite to that of said current limiting layer.

3. A high-output semiconductor laser in accordance with claim 1, wherein said groove having said dove-tail shaped cross-section has a pair of side walls, each having a lower part which is inclined upward and inwardly and an upper part which is inclined upwardly and outwardly.

4. A high-output semiconductor laser of the double heterojunction type comprising:
   an n-GaAs substrate having a flat surface and groove of a dove-tail-shaped cross-section formed in said substrate below said flat surface,
   an $n-Ga_{1-x}Al_xAs$ clad layer formed on said n-GaAs substrate,
   a non-doped $Ga_{1-x}Al_xAs$ flat active layer, having a thickness sufficient to spread the lasing light, said flat active layer being formed on said $n-Ga_{1-x}Al_xAs$ clad layer,
   a $p-Ga_{1-x}Al_xAs$ clad layer formed on said $n-Ga_{1-x}Al_xAs$ clad layer,
   an n-GaAs layer formed on said $n-Ga_{1-x}Al_xAs$ clad layer, and a p-impurity diffused from the surface of said n-GaAs layer to said p-Ga$_{1-x}$Al$_x$As clad layer, said dove-tail cross section having upper and lower parts which are both wider than a middle part of said cross section.

5. A high-output semiconductor laser of the double heterojunction type in accordance with claim 4, wherein said p-impurity is Zn.

* * * * *